(12) United States Patent
Hause et al.

(10) Patent No.: US 6,353,253 B2
(45) Date of Patent: *Mar. 5, 2002

(54) SEMICONDUCTOR ISOLATION REGION BOUNDED BY A TRENCH AND COVERED WITH AN OXIDE TO IMPROVE PLANARIZATION

(75) Inventors: Fred N. Hause; Basab Bandyopadhyay; H. Jim Fulford, Jr.; Robert Dawson, all of Austin; Mark W. Michael, Cedar Park; William S. Brennan, Austin, all of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/227,914

(22) Filed: Jan. 8, 1999

Related U.S. Application Data

(62) Division of application No. 08/642,155, filed on May 2, 1996, now Pat. No. 5,899,727.

(51) Int. Cl.⁷ .................................................. H01L 29/00
(52) U.S. Cl. ...................................... 257/510; 257/513
(58) Field of Search ............................... 257/510–513, 257/506, 397, 374; 438/427, 424, 412, 425, 444, 448

(56) References Cited

U.S. PATENT DOCUMENTS

| 4,211,582 A | 7/1980 | Horng et al. |
| 4,274,909 A | 6/1981 | Venkataraman et al. |

(List continued on next page.)

FOREIGN PATENT DOCUMENTS

| EP | 0300569 | 1/1989 |
| EP | 0461498 | 12/1991 |
| EP | 0488625 A2 * | 6/1992 |
| JP | 56-140641 | 11/1981 |
| JP | 57-91535 | 6/1982 |

(List continued on next page.)

OTHER PUBLICATIONS

Wolf, et al., "Silicon Processing For The VLSI Era," vol. 1, Lattice Press, 1986, pp. 407–458.

*Primary Examiner*—Sara Crane
*Assistant Examiner*—Thien F Tran
(74) *Attorney, Agent, or Firm*—Conely, Rose & Tayon, PC; Robert C. Kowert

(57) ABSTRACT

An isolation technique is provided for improving the overall planarity of isolation regions relative to adjacent active area silicon mesas. The isolation process results in a trench formed in field regions immediately adjacent the active regions. The trench, however, does not extend entirely across the field region. By preventing large area trenches, substantial dielectric fill material and the problems of subsequent planarization of that fill material is avoided. Accordingly, the present isolation technique does not require conventional fill dielectric normally associated with a shallow trench process. While it achieves the advantages of forming silicon mesas, the present process avoids having to rework dielectric surfaces in large area field regions using conventional sacrificial etchback, block masking and chemical-mechanical polishing. The improved isolation technique hereof utilizes trenches of minimal width etched into the silicon substrate at the periphery of field regions, leaving a field mesa. A field dielectric, preferably oxide, is formed upon the field mesa and fills trenches between the field mesa and active mesas, leaving a substantially planar field dielectric commensurate with the upper surface of adjacent active mesas.

8 Claims, 5 Drawing Sheets

U.S. PATENT DOCUMENTS

| | | | |
|---|---|---|---|
| 4,385,975 A | 5/1983 | Chu et al. | |
| 4,390,393 A | 6/1983 | Ghezzo et al. | |
| 4,445,967 A | 5/1984 | Kameyama | |
| 4,532,701 A | 8/1985 | Kameyama et al. | |
| 4,671,970 A | 6/1987 | Keiser et al. | |
| 4,868,136 A | 9/1989 | Ravaglia | |
| 4,871,865 A | 10/1989 | Taka et al. | |
| 4,873,203 A | 10/1989 | Kaga et al. | |
| 4,906,585 A | 3/1990 | Neppl et al. | |
| 4,952,524 A | 8/1990 | Lee et al. | |
| 4,980,311 A | 12/1990 | Namose | |
| 4,994,406 A | 2/1991 | Vasquez et al. | |
| 5,004,703 A | 4/1991 | Zdebel et al. | |
| 5,011,788 A | 4/1991 | Kawaji et al. | |
| 5,096,848 A | 3/1992 | Kawamura | |
| 5,175,122 A | 12/1992 | Wang et al. | |
| 5,175,607 A * | 12/1992 | Ikeda | 257/511 |
| 5,192,707 A * | 3/1993 | Hodges et al. | 438/448 |
| 5,225,358 A | 7/1993 | Pasch | |
| 5,229,315 A | 7/1993 | Jun et al. | |
| 5,229,316 A | 7/1993 | Lee | |
| 5,231,046 A | 7/1993 | Tasaka | |
| 5,292,689 A | 3/1994 | Cronin | |
| 5,294,562 A | 3/1994 | Lur et al. | |
| 5,308,784 A | 5/1994 | Kim et al. | |
| 5,308,786 A | 5/1994 | Lur | |
| 5,360,753 A * | 11/1994 | Park et al. | 438/421 |
| 5,371,036 A | 12/1994 | Lur et al. | |
| 5,372,950 A | 12/1994 | Kim et al. | |
| 5,372,968 A | 12/1994 | Lur et al. | |
| 5,457,339 A * | 10/1995 | Komori et al. | 257/510 |
| 5,465,003 A * | 11/1995 | Lur et al. | 257/510 |
| 5,599,731 A * | 2/1997 | Park | 438/440 |
| 5,677,232 A * | 10/1997 | Kim et al. | 438/425 |
| 5,691,252 A | 11/1997 | Pan | |
| 5,696,020 A | 12/1997 | Ryum et al. | |
| 5,696,021 A * | 12/1997 | Chan et al. | 438/425 |
| 5,899,727 A | 5/1999 | Hause et al. | |
| 5,904,539 A | 5/1999 | Hause et al. | |
| 5,923,073 A * | 7/1999 | Aoki et al. | 257/513 |
| 5,926,713 A | 7/1999 | Hause et al. | |
| 5,981,357 A | 11/1999 | Hause et al. | |

FOREIGN PATENT DOCUMENTS

| | | |
|---|---|---|
| JP | 58-42251 | 3/1983 |
| JP | 58-220444 | 12/1983 |
| JP | 59-87831 | 5/1984 |
| JP | 0186342 | 10/1984 |
| JP | 0015944 | 1/1985 |
| JP | 60-38831 | 2/1985 |
| JP | 61-85838 | 5/1986 |
| JP | 61-166042 | 7/1986 |
| JP | 2-140951 | 5/1990 |
| JP | 0272745 | 11/1990 |
| JP | 0062946 | 3/1991 |
| JP | 3-96249 | 4/1991 |
| JP | 0190663 | 7/1993 |

* cited by examiner

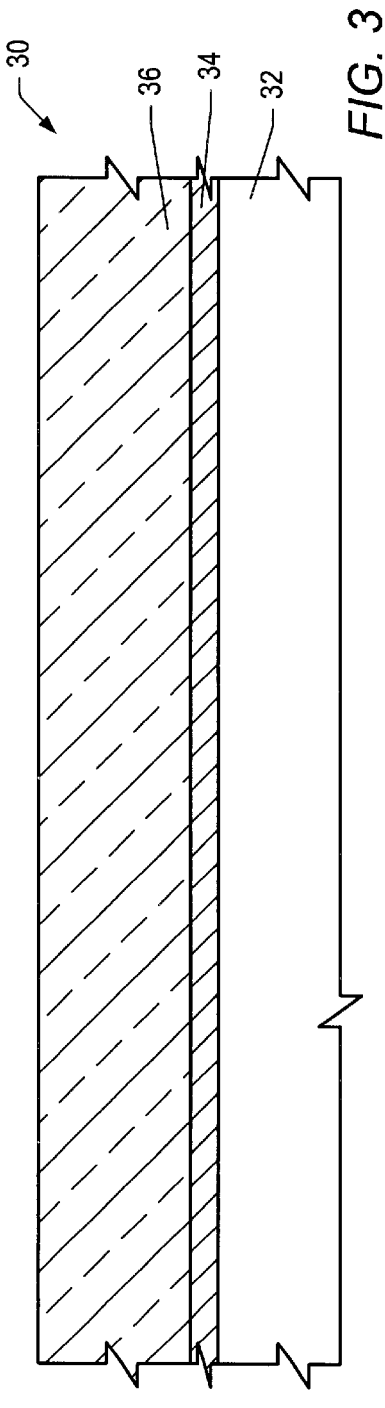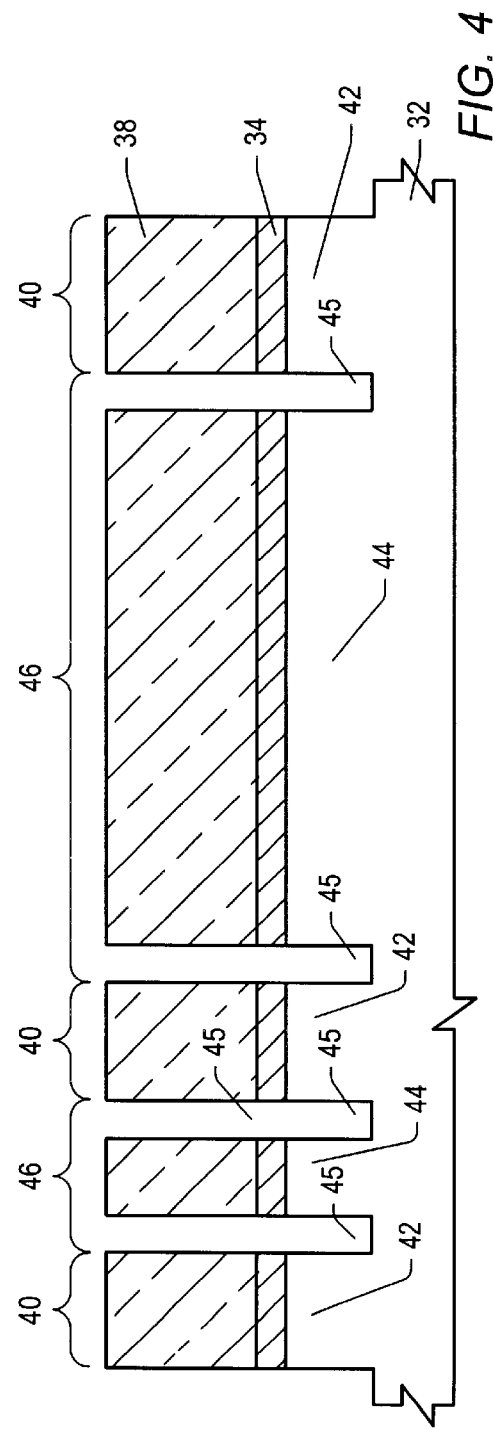

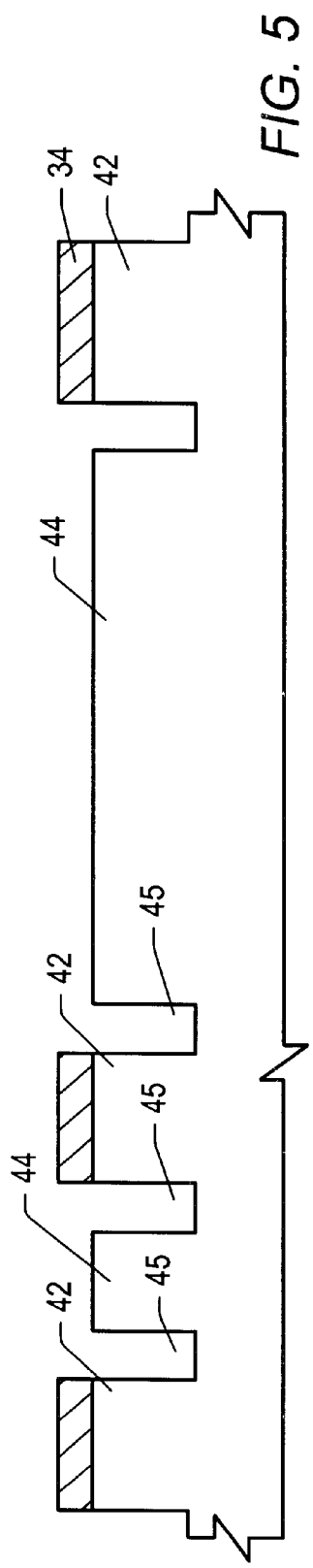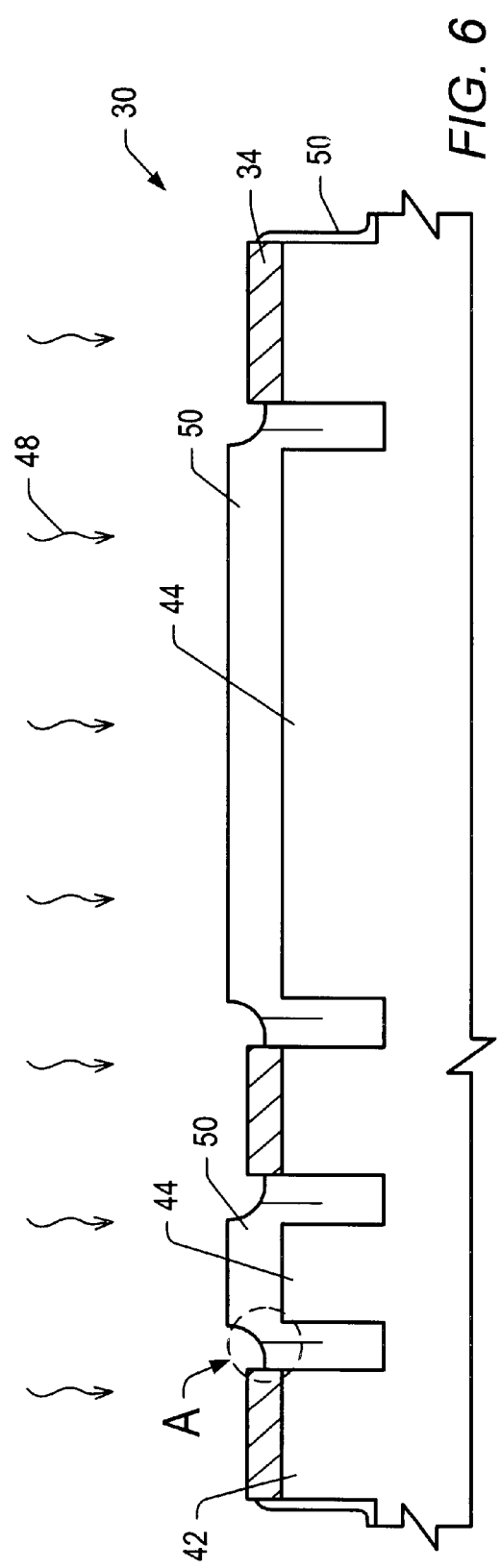

SEMICONDUCTOR ISOLATION REGION BOUNDED BY A TRENCH AND COVERED WITH AN OXIDE TO IMPROVE PLANARIZATION

This application is a division of Ser. No. 08/642,155 filed May 2, 1996 now U.S. Pat. No. 5,899,727.

BACKGROUND OF THE INVENTION

1. Field of the Invention

This invention relates to semiconductor fabrication and more particularly to an improved process of planarizing a field dielectric upper surface commensurate with adjacent active regions. The improved planarization process involves etching trenches about the field region to form field mesas, and then oxidizing the field mesas and trenches to produce a field dielectric which extends in planar fashion entirely across the field region.

2. Description of the Relevant Art

The fabrication of an integrated circuit involves placing numerous devices in a single semiconductor substrate. Select devices are interconnected by a conductor which extends over a dielectric which separates or "isolates" those devices. Implementing an electrical path across a monolithic integrated circuit thereby involves selectively connecting isolated devices. When fabricating integrated circuits it must therefore be possible to isolate devices built into the substrate from one another. From this perspective, isolation technology is one of the critical aspects of fabricating a functional integrated circuit.

A popular isolation technology used for an MOS integrated circuit involves the process of locally oxidizing silicon. Local oxidation of silicon, or LOCOS process involves oxidizing field regions between devices. The oxide grown in field regions are termed field oxide, wherein field oxide is grown during the initial stages of integrated circuit fabrication, before source and drain implants are placed in device areas or active areas. By growing a thick field oxide in isolation (or field) regions pre-implanted with a channel-stop dopant, LOCOS processing serves to prevent the establishment of parasitic channels in the field regions.

While LOCOS has remained a popular isolation technology, there are several problems inherent with LOCOS. First, a growing field oxide extends entirely across the field region and laterally as a bird's-beak structure. In many instances, the bird's-beak structure can unacceptably encroach into the device active area. Second, the pre-implanted channel-stop dopant of ten times redistributes during the high temperatures associated with field oxide growth. Redistribution of channel-stop dopant primarily affects the active area periphery causing problems known as narrow-width effects. Third, the thickness of field oxide causes large elevational disparities across the semiconductor topography between field and active regions. Topological disparities cause planarity problems which become severe as circuit critical dimensions shrink. Lastly, thermal oxide growth is significantly thinner in small field (i.e., field areas of small lateral dimension) regions relative to large field regions. In small field regions, a phenomenon known as field-oxide-thinning effect therefore occurs. Field-oxide-thinning produces problems with respect to field threshold voltages, interconnect-to-substrate capacitance, and field-edge leakage in small field regions between closely spaced active areas.

Many of the problems associated with LOCOS technology are alleviated by an isolation technique known as the "shallow trench process". Despite advances made to decrease bird's-beak, channel-stop encroachment and non-planarity, it appears that LOCOS technology is still inadequate for deep submicron MOS technologies. The shallow trench process is better suited for isolating densely spaced active devices having field regions less than one micron in lateral dimension.

The trench process involves the steps of etching a silicon substrate surface to a relatively shallow depth, e.g., between 0.2 to 0.5 microns, and then refilling the shallow trench with a deposited dielectric. Some trench processes include an interim step of growing oxide on trench walls prior to the trench being filled with a deposited dielectric. After the trench is filled, it is then planarized to complete the isolation structure.

The trench process eliminates bird's-beak and channel-stop dopant redistribution problems. In addition, the isolation structure is fully recessed, offering at least a potential for a planar surface. Still further, field-oxide thinning in narrow isolation spaces does not occur and the threshold voltage is constant as a function of channel width.

While the trench isolation process has many advantages over LOCOS, it cannot in all instances achieve complete global planarization across the entire semiconductor topography. The upper surface of fill dielectric in large isolation areas are generally at lower elevational levels than the upper surface fill dielectric in small isolation areas. The fill dielectric readily deposits in small area trenches such that the elevation of the fill dielectric in a small area is greater than the elevation within a large area trench. Accordingly, subsequent processing is needed to bring the large area fill topography to the same elevational level as small area fill topography.

Most researchers have focused upon fairly complex processes for planarizing large and small area fill dielectrics. Those processes generally involves rework of the fill dielectric. A popular rework technique involves depositing a sacrificial layer across the fill dielectric topography, and then removing the sacrificial layer at the same etch rate as the underlying dielectric. Generally, the sacrificial layer is deposited as a low-viscosity liquid. Baking the liquid, or exposing it to ultraviolet light, causes the liquid to convert to solid form in a sol-gel reaction. Popular sacrificial materials include photoresist, polyimide or spin-on glass (SOG). The sacrificial layers generally etch back in a plasma until the topmost regions of the fill dielectric are exposed. The etch chemistry is then modified so that the sacrificial layer material and the underlying fill dielectric are etched at approximately the same rate. The etch is continued until all of the sacrificial layer has been etched away, leaving a somewhat planar dielectric upper surface.

The sacrificial etchback technique is generally valid only for the planarization of topographies in which features are less than 10 $\mu$m (microns) apart. For large regions between trenches, the step height will not be reduced, since the photoresist thickness on top of such features will be the same as the thickness over the adjacent trench.

In an effort to overcome the shortcomings of the etchback process, a planarization block mask may be used. In this procedure, a liquid material is applied and developed as a planarization film followed by a block mask used to expose and develop this film. The block mask protects topography in wide, low regions from a subsequent etch plasma. The upper surface of high regions can then be removed to an elevational level commensurate with the protected low regions. The planarization block mask involves an additional lithography step and a mask which is produced by selectively reversing the mask used in producing the underlying topography. Mask reversal may involve errors due to changes in the resist thickness caused by the underlying pattern, misalignment, etc.

In an effort to eliminate the complex deposition, patterning and etch processes involved with sacrificial deposition, etch back, and the block masking, many manufacturers have directed their attention to chemical-mechanical polishing (CMP). Application of a chemical slurry and an abrasive polishing pad across the entire semiconductor topography, allows planarization of that topography commensurate with the planarity of the pad surface. Unfortunately, however, when force is applied to a pad, the pad will oftentimes conform to the unevenness of that topography. Thus, while high elevation areas, or peaks, receive substantial polishing, low elevational areas (or valleys) are also abraded.

A better understanding of the problems inherent with CMP are illustrates in reference to FIGS. 1 and 2. FIG. 1 depicts a partial cross-section of a semiconductor topography 10. Topography 10 includes a substrate 12 which has been fashioned with a small area trench 14 and a large area trench 16 according to the trench isolation process. Trenches 14 and 16 define field areas between active regions, wherein active regions are defined as silicon mesas 18 which extend from an elevation equivalent to the trench base. Deposited upon and between mesas 18 is a fill dielectric 20.

FIG. 2 illustrates a processing step subsequent to that shown in FIG. 1. Specifically, the upper surface of fill dielectric material 20 receives CMP. The polishing pad inherently flexes or conforms under pressure to the upper surface of dielectric 20, causing the polishing pad to attack and remove dielectric 20 upper surface in large area trench 16, albeit to a lesser degree than the removal of dielectric 20 in small area trench 14. If dielectric in large area trench 16 is not sufficiently thick to withstand the attack, the dielectric upper surface will be removed below the desired planar elevation. Thus, a slight recess of dielectric 20 upper surface occurs at the conclusion of CMP. That recess is shown as reference numeral 22. Isolated mesas may also show erosion of the silicon surface due to CMP.

A need therefore exists in producing a process which can utilize the advantages of the shallow trench isolation technique. The desired process must, however, not bear the disadvantages of a non-planar shallow trench. More specifically, an improved process must be derived which does not produce the problems inherent in using a fill dielectric followed by planarization rework. Thus, the desired process must be one which avoids having to use, for example, a sacrificial etchback, block mask and/or CMP.

Avoiding conventional planarization processes thereby avoids the problems of not being able to achieve complete global planarization. Global planarization is defined as the planarization of the field dielectric between active areas, regardless of the relative size differences and densities between field region areas. More specifically, a process must be derived which can planarize field dielectric in large isolation regions as well as small isolation regions. Large area field regions are those defined as having a width or length greater than 16.0 microns. Field regions are defined as those regions which do not contain active devices. All active devices (e.g., transistors, etc.) are formed in active regions which reside between field regions. A need therefore exists for forming a field dielectric upper surface that is substantially planar and equivalent to all other field dielectric and active area upper surfaces which extend across the entire wafer topography. The desired process thereby achieves global planarization with minimal planarization steps.

SUMMARY OF THE INVENTION

The problems outlined above are in large part solved by an improved shallow trench process of the present invention. The improved process hereof serves to form silicon mesas in active areas by forming a trench of defined width immediately adjacent the periphery of each active area. The trench is etched into the silicon substrate within the field region, leaving a silicon mesa in each active region, but also leaving a silicon mesa in a field region. A silicon mesa within an active region is herein defined as an "active mesa" and a silicon mesa within a field region is herein defined as a "field mesa". Thus, instead of forming a trench entirely across the field region as in conventional processes, the present process forms a narrow trench only at the periphery of the field region.

The field mesa can be of varying size, depending upon the field region dimension. Accordingly, in large field regions, the field mesa is also large. In small field regions, the field mesa can be small, or non-existent. In all instances, the trench formed within the field region, at the juncture between active and field regions is of a pre-defined width. The trench width is fixed, preferably between 0.1 to 1.0 microns. The fixed, defined width of the trench is necessary to ensure a trench fill during subsequent field dielectric formation.

The field mesa includes an upper surface which is substantially planar with respect to the laterally spaced active mesas. The field mesa upper surface, being silicon, allows growth of planarizing (and/or fill) dielectric material thereon. The field dielectric is placed upon the field mesa and in trenches which surround each field mesa in a step subsequent to the step used in forming the field mesa. The field dielectric serves to prevent inversion of the field area by a powered, overlying interconnect. The field dielectric extends between active area silicon mesas, entirely across the dielectric-filled trenches and dielectric-covered field mesas.

Preferably, the field dielectric is a thermally grown oxide. The oxide forms as a result of removing an oxide barrier layer from the field mesas but not from the silicon mesas in active areas. When the field oxide grows, a curvature occurs at the field oxide upper surface immediately adjacent the active area. Presence of the curvature serves to minimize the elevational step of an interconnect extending from the active region to the field region. Preferably, the field oxide is grown to a thickness of 0.2 to 0.4 microns. As the field oxide grows, it partially consumes the field mesa upper and sidewall surfaces leaving a larger critical dimension between the silicon field areas and overlying interconnect extending into active regions.

Broadly speaking, the present invention contemplates a method for forming a field dielectric. The method includes the steps of providing a silicon substrate having a field region bounded by at least one active region. A trench is then formed of defined width within the field region immediately adjacent the active region to form a field mesa. The field mesa is completely bounded by the trench. A field dielectric is then grown upon the field mesa and within the trench. The resulting field dielectric thereby includes an upper surface which is substantially planar across the field region commensurate with, and slightly above, the upper surface of the active region. Advantageously, the field dielectric is planar across the field mesa, regardless of the field mesa lateral area. As such, the present method achieves a field dielectric upper surface which is at substantially the same elevation entirely across the field area, regardless of field area size.

The present invention further contemplates a field region comprising a field mesa extending from a silicon substrate a lateral spaced distance from an active area. The field region further includes a field dielectric which covers the field mesa and fills the lateral spaced distance between the field mesa and the active area.

Still further, the present invention contemplates a field region comprising a trench extending into a silicon substrate about the periphery of the field region to form a field mesa. A field dielectric is configured across the field mesa and the trench. The field dielectric thereby fills the trench and leaves a substantially planar upper surface which extends entirely across the field region.

BRIEF DESCRIPTION OF THE DRAWINGS

Other objects and advantages of the invention will become apparent upon reading the following detailed description and upon reference to the accompanying drawings in which:

FIG. 3 is a partial cross-sectional view of a semiconductor topography with photoresist applied across the topography according to an exemplary embodiment of the present invention;

FIG. 4 is a processing step subsequent to FIG. 3, wherein the photoresist is patterned and trench regions of fixed, pre-defined width are formed at the periphery of the field regions resulting in field mesas;

FIG. 5 is a processing step subsequent to FIG. 4, wherein the entire photoresist layer is removed, and select portions of underlying protectant layer are removed from the field mesas;

FIG. 6 is a processing step subsequent to FIG. 5, wherein a field dielectric is formed entirely across the field mesas and in trench regions which bound each field mesa;

Figure 1:
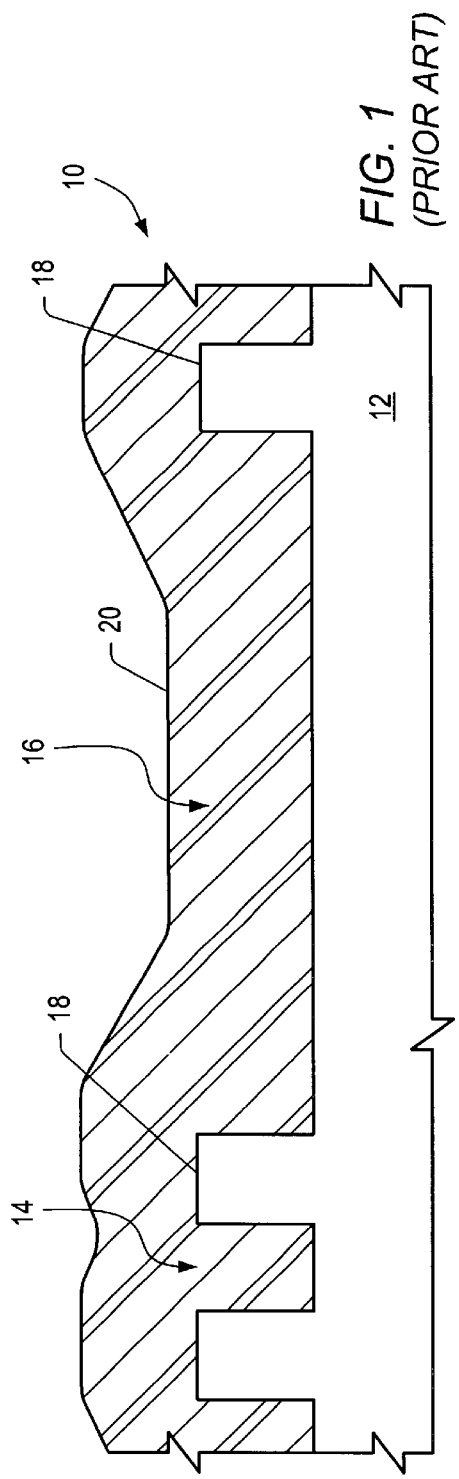
FIG. 1 is a partial cross-sectional view of a semiconductor topography with fill dielectric deposited upon and between active mesas formed according to a conventional shallow trench process.
Figure 2:
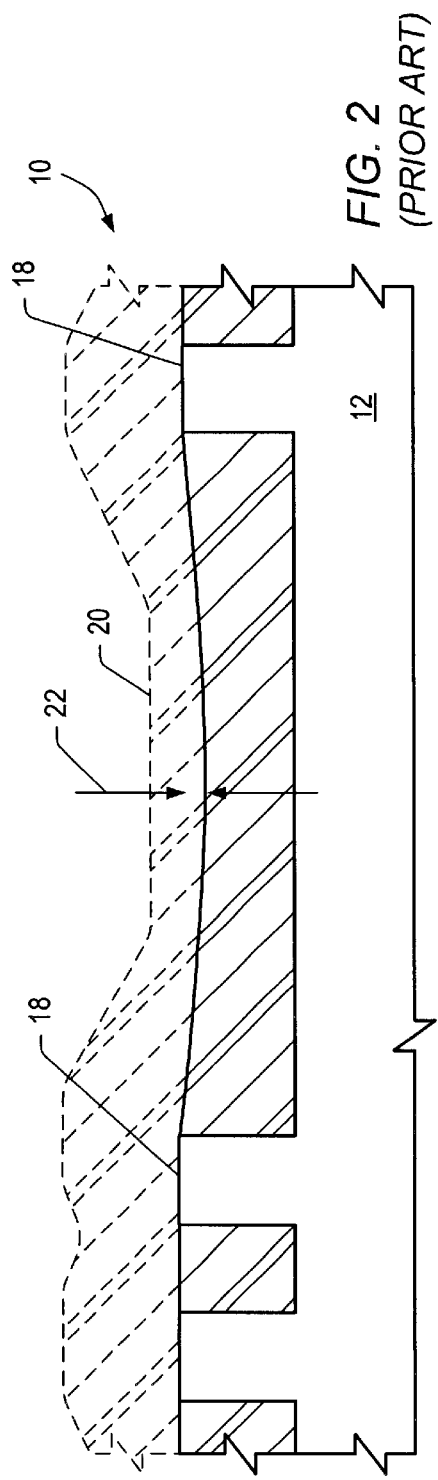
FIG. 2 is a processing step subsequent to that of FIG. 1, wherein the upper topography of fill dielectric is removed to uneven planarization levels according to a conventional CMP process.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 3 is a partial cross-sectional view of a semiconductor topography 30. Topography 30 includes a substrate 32, upon which a protective layer 34 is formed. Deposited across the entire protective layer is a photoresist layer 36. Substrate 32 is preferably made from a single crystal silicon. Protective layer 34 comprises any layer which protects the silicon surface from etch materials and/or oxidation, and photoresist 36 includes any material which can selectively polymerize when exposed to ultraviolet light. Topography 30 can include any topography from which an integrated circuit such as metal oxide semiconductor (MOS) is fashioned.

FIG. 4 illustrates a processing step subsequent to FIG. 3. Specifically, a pattern is printed upon photoresist 36, and select regions are exposed and developed. The polymerized regions of photoresist 36 are represented as reference numerals 38. Polymerized photoresist 38 protects the underlying material from etchant. Some of the areas protected by photoresist 38 include active regions 40. Active regions 40 represent areas where transistors will be formed, and are generally designated in areas exclusive of field regions 46.

The patterned photoresist allows etchant to remove between, e.g. 0.2 to 1.0 micron of substrate material 32. The removed regions are designated as trenches, and the non-removed regions are designated as either active mesas 42 or field mesas 44. Active mesas 42 exist only in active regions 40, while field mesas 44 exist only in field regions 46. Trenches 45 are placed in field regions 46, and specifically at the outer periphery of each field region 46. Trenches 45 are each of the same width, preferably between 0.1 to 1.0 micron. Trenches 45 exist only within field region 46, at the juncture between field mesas 44 and active mesas 42. Accordingly, the lateral dimensions of active mesas 42 are defined by the size and quantity of various devices placed therein; however, the lateral dimensions of field mesas 44 depend upon the size of corresponding field regions 46.

If, for example, a large field region is encountered, then given the fixed width of trench 45, field mesas 44 will also be quite large. A large field mesa 44 is defined as one having a lateral area in which active regions 40 on opposing sides of the field mesa are, for example, spaced more than 5.0 to 16.0 microns apart. Small field mesas 44 are generally defined as ones between active areas spaced less than 5.0 to 16.0 microns, and more likely between 1.0 to 5.0 microns apart. In many instances, the spacings between active areas may be less than 1.0 micron, in which case sufficient real estate may not be available to form a field mesa therebetween. In this instance, trench 45 formed adjacent the closely spaced active areas 40 will substantially merge to prevent the occurrence of a field mesa.

Referring to FIG. 5, a processing step subsequent to FIG. 4 is shown. FIG. 5 illustrates removal of patterned photoresist 38 from field mesas 44 and active mesas 42. Protective layer 34 is removed only from field mesas 44, and not from active mesas 42.

FIG. 6 illustrates a processing step subsequent to that shown in FIG. 5. The exposed regions of topography 30, i.e., regions absent protective layer 34 allow accumulation of a field dielectric 50 thereon. According to one embodiment, field dielectric 50 comprises an oxide. The oxide is formed from an oxidizing ambient, and in the presence of thermal energy shown by reference numeral 48. The oxidizing ambient causes dielectric 50 to grow upon and within the upper surface and sidewalls of field dielectric 50. Protective layer 34, however, is substantially impermeable to the oxidizing ambient and thereby prevents growth of dielectric 50 upon or below the protective layer. Typically, for an oxide thickness of t, 0.45 t of silicon would be consumed, and the oxide surface will rise approximately 0.55 t above the original silicon surface of field mesa 44. As an example, if trench 45 width is 3000 angstroms, then for the trench width to be completely filled with grown oxide, approximately 2730 angstroms of oxide must be grown upon and within the trench sidewall. Accordingly, for the above example, approximately 2730 angstroms of dielectric 50 exists at the upper surface of field mesas 44. It is important that trench 45 width be constant by an amount which can be readily filled with sufficient dielectric thickness to prevent capacitive coupling of overlying interconnect to underlying field areas. The above example provides 2730 angstroms of field oxide thickness, which in most instances prevents field inversion of a powered interconnect placed thereon. The field oxide thickness can certainly be enhanced by increasing the exposure time and/or thermal energy to provide even further protection against field inversion.

Figure 7:
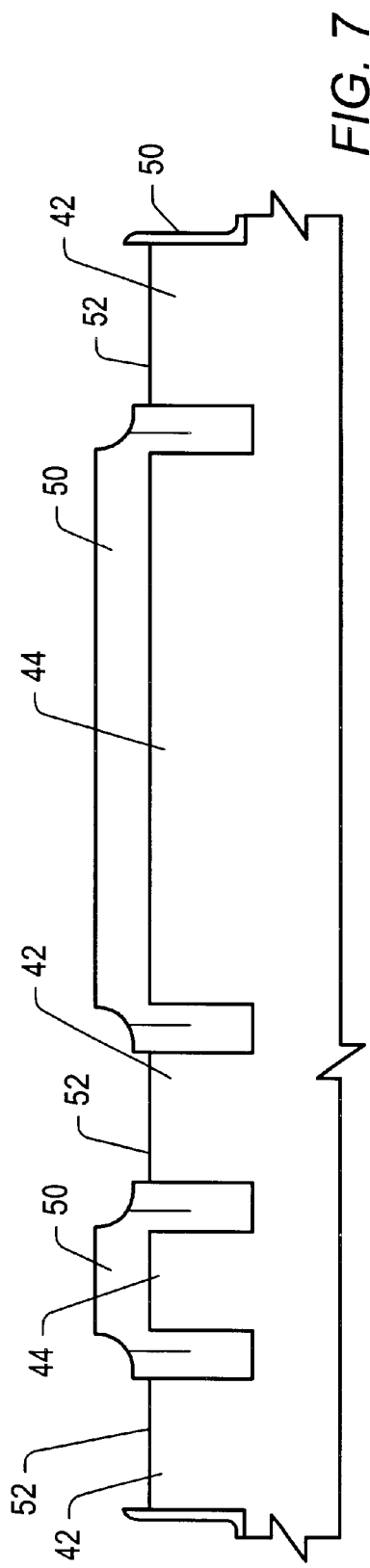
FIG. 7 is a processing step subsequent to FIG. 6, wherein the remaining portions of the protectant layer are removed.

Turning now FIG. 7, a processing step is shown whereby the remaining protective layer 34 is removed. Specifically, protective layer 34 is removed from active mesas 42, leaving a silicon surface upon and within which active devices are formed. Receptive to gate oxide, polysilicon and source/drain implants, the active mesa silicon surface is denoted in FIG. 7 as reference numeral 52.

Figure 8:
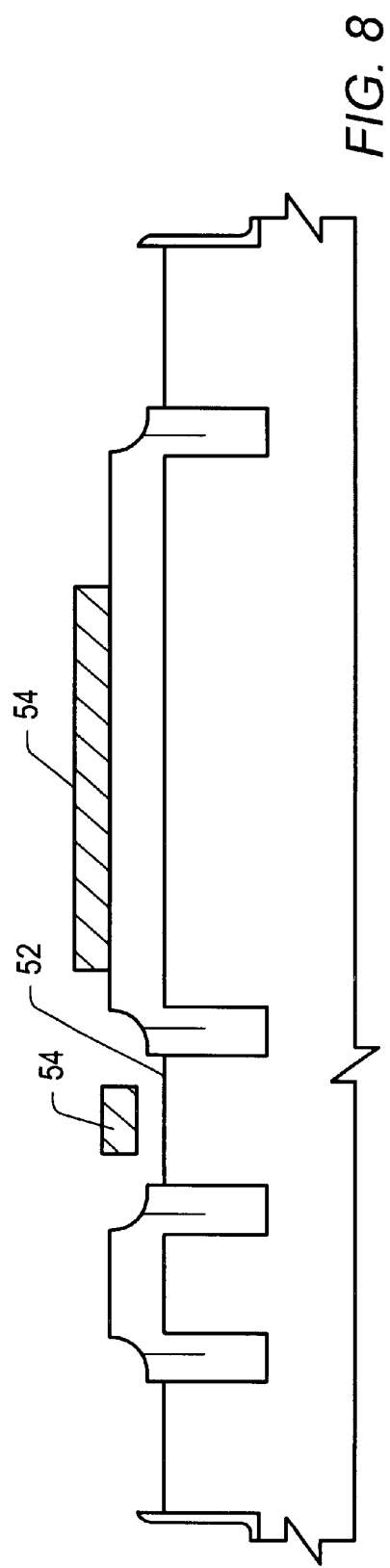
FIG. 8 is a processing step subsequent to FIG. 7, wherein an exemplary conductor is formed upon the field dielectric and active mesas.

FIG. 8 illustrates a processing step subsequent to FIG. 7, wherein a conductor 54, fashioned from an interconnect layer, is formed upon field dielectric 50 and is formed a spaced distance above active area surface 52. Conductor 54 can, according to one embodiment, comprise a polysilicon material. Alternatively, conductor 54 can comprise a refractory metal, or metal silicide. Conductor 54 can extend partially across or entirely across the field region, and can include a gate conductor arranged only partially across an active region. Field dielectric 50 thereby suffices to prevent field inversion during times when conductor 54 receives an operating voltage.

Figure 9:
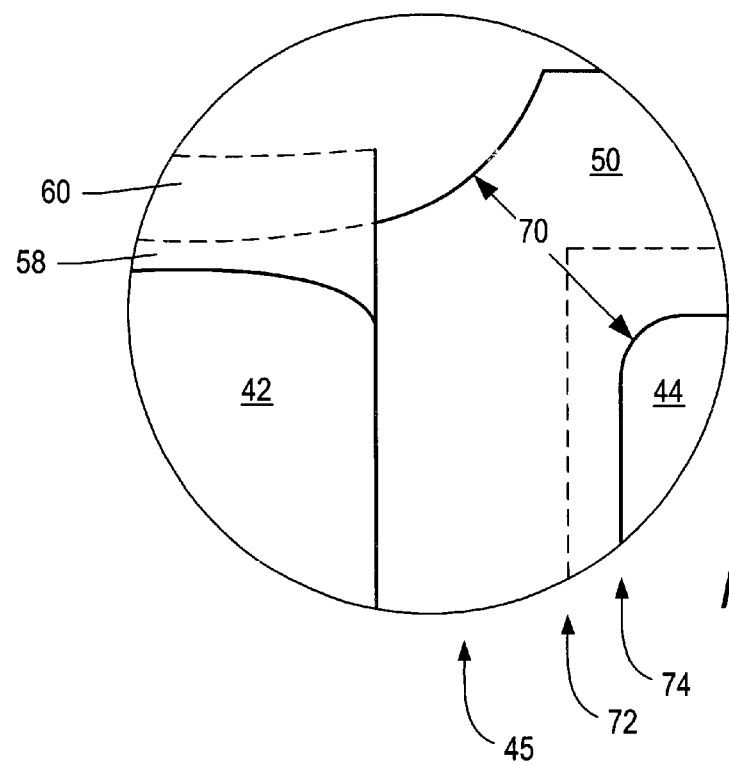
FIG. 9 is a detailed view along area A of FIG. 6 according to one exemplary embodiment.
Figure 10:
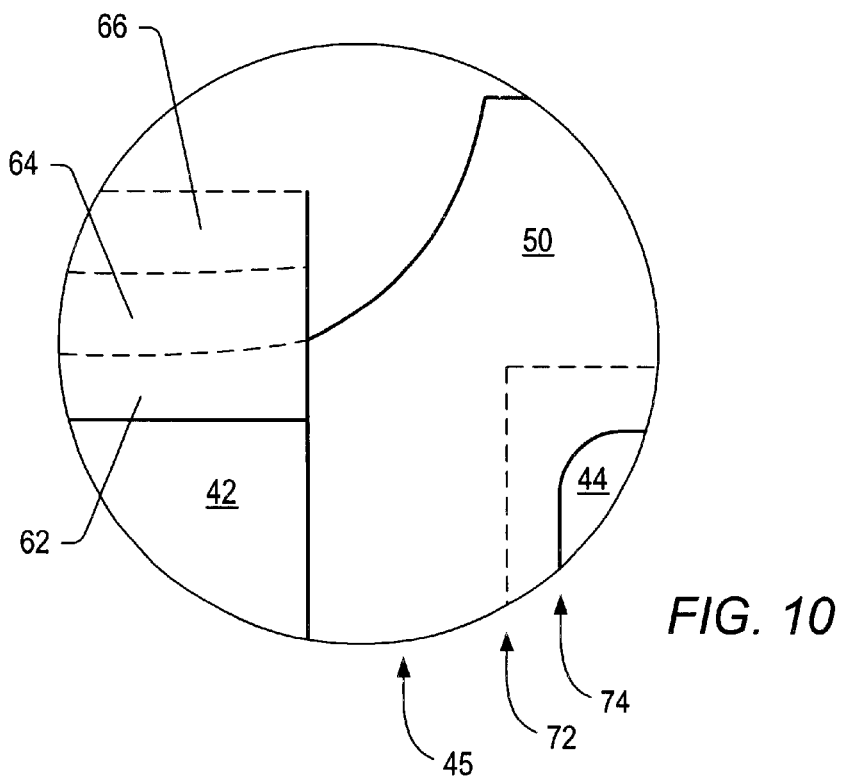
FIG. 10 is a detailed view along area A of FIG. 6 according to another exemplary embodiment.

Turning now to FIGS. 9 and 10, a detailed illustration along area A of FIG. 6 is shown according to alternative embodiments. FIG. 9 illustrates a corner and sidewall portion of field mesa 44 as well as active mesa 42. Field mesa 44 and active mesa 42 are separated by trench 45. Arranged upon active mesa 42, according to one embodiment, is a pad oxide 58 and a nitride 60. According to another embodiment, formed upon active mesa 42 is a tri-layer structure comprising pad oxide 62, polysilicon 64 and nitride 66. FIG. 9 illustrates one embodiment, whereas FIG. 10 illustrates the other. In either instance, the bi- or tri-layer structure represents the protective layer set forth hereinabove.

In a processing step subsequent to FIG. 6, oxide and nitride layers 58 and 60 are removed, as shown by the dashed lines in FIG. 9. However, prior to removal, field dielectric 50 within trench 45 causes a consumption of silicon at the corner of active mesas 42. Accordingly, active mesa 42 appears slightly rounded at its corner after layers 58 and 60 are removed. Pad oxide 58, nonetheless, allows growth of field dielectric 50 in the form shown, having a critical dimension 70. Critical dimension 70 is defined as the spacing between field mesa corner 44 and the closest upper surface of field dielectric 50. Interconnect which resides upon field dielectric 50 at the field/active area juncture encounters maximum capacitive coupling to field mesa 44 along critical dimension 70. Critical dimension 70, however, according to the present process is at or near the thickness of field dielectric 50 directly above field mesa 44. Enhancement of critical dimension 70 is due in part to the consumption of silicon at the field mesa corner. Any coupling arising between interconnect above trench 45 is thereby minimized.

According to an alternative embodiment, active mesa 42 includes a tri-layer structure described above and shown in FIG. 10. The tri-layer structure of pad oxide 62, polysilicon 64 and nitride 66 helps buffer the growing field dielectric 50. By buffering field dielectric 50 during its growth, rounding of a silicon corner of active mesa 42 is minimized.

Both FIGS. 9 and 10 illustrate a benefit of using grown oxide as field dielectric 50. As oxide grows, the initial silicon boundary 72 extends into the silicon, leaving a finalized boundary 74. By moving the silicon boundary laterally and downward, especially at the corners according to the square root of the squared sum, critical dimension 70 is increased. Accordingly, not only does thermally grown oxide produce a dielectric of low permittivity, but also reduces the capacitive coupling in critical dimension areas directly above trenches 45.

It will be appreciated to those skilled in the art having the benefit of this disclosure that this invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, specification and drawings are regarded in an illustrative rather than a restrictive sense.

What is claimed is:

1. A semiconductor isolation structure, comprising:
   a first field region extending from a first active region to a second active region;
   a first trench immediately adjacent said first active region and a second trench immediately adjacent said second active region to form a first field mesa within said first field region, wherein said first field mesa extends from said first trench to said second trench, wherein an upper surface of said field mesa is lower than an upper surface of said first and second active regions, and wherein corners of said field mesa curve downward from said upper surface of said field mesa to said first and second trenches respectively; and
   a field dielectric grown upon said first field mesa and within said first and second trenches, wherein said field dielectric is inhibited from growing on said first and second active regions, and wherein an upper surface of said field dielectric is higher than said upper surface of said first and second active regions.

2. The semiconductor isolation structure as recited in claim 1, further comprising:
   a second field region extending from a third active region to a fourth active region, wherein said third active region is spaced less than 5 microns from said fourth active region by said second field region; and
   a third trench immediately adjacent said third active region and a fourth trench immediately adjacent said fourth active region to form a second field mesa within said second field region, wherein said second field mesa extends from said third trench to said fourth trench;
   wherein said first active region is spaced more than 16 microns from said second active region by said first field region.

3. The semiconductor isolation structure as recited in claim 2, wherein said second and said third active regions are the same active region.

4. The semiconductor isolation structure as recited in claim 2, wherein said first, second, third and fourth trenches all have the same width.

5. A semiconductor isolation structure, comprising:

a first field region extending from a first active region to a second active region;

a first trench adjacent said first active region and a second trench adjacent said second active region to form a first field mesa within said first field region;

a first field dielectric on said first field mesa and within said first and second trenches, wherein an upper surface of said first field dielectric is higher than upper surfaces of said first and second active regions;

a second field region extending from a third active region to a fourth active region, wherein said third active region is spaced less than 1 micron from said fourth active region by said second field region;

a third trench extending completely across said second field region from said third active region to said fourth active region; and a second field dielectric within said third trench.

6. A field region separating a first active region from a second active region, comprising:

a first trench laterally spaced from a second trench by a field mesa, wherein said first trench is arranged immediately adjacent the first active region and said second trench is arranged immediately adjacent the second active region, wherein said field mesa extends from said first trench to said second trench, wherein said field mesa has a substantially planar upper surface, wherein corners of said field mesa curve downward from said substantially planar upper surface to said first and second trenches respectively, and wherein said field mesa and the first and second active regions are contiguous parts of a semiconductor substrate; and a field dielectric upon said field mesa and within said first trench and said second trench, wherein said field dielectric does not extend upon the first and second active regions arranged immediately adjacent said first and said second trenches respectively, and wherein an upper surface of said field dielectric is higher than an upper surface of said first and second active regions.

7. The field region as recited in claim 6, wherein corners of the first and second active regions arranged immediately adjacent said first and said second trenches respectively are substantially square.

8. A semiconductor device comprising:

a first active region and a second active region;

a field region separating the first and second active regions, comprising a first trench immediately adjacent the first active region, and a second trench immediately adjacent the second active region, and a field mesa extending from the first to the second trench, wherein the field mesa has a substantially planar upper surface, wherein corners of said field mesa curve downward from said substantially planar upper surface to said first and second trenches respectively, and wherein the field mesa and the first and second active regions are contiguous parts of a semiconductor substrate; and a field dielectric within the first and second trenches and upon the field mesa, wherein the field dielectric is a single contiguous oxide layer that completely fills the first and second trenches, wherein the field dielectric does not extend upon the first and second active regions, wherein the field dielectric has a substantially planar upper surface, and wherein an upper surface of said field dielectric has a higher elevation than the first and second active regions.

* * * * *